(12) United States Patent
Jung et al.

(10) Patent No.: US 10,791,661 B2
(45) Date of Patent: Sep. 29, 2020

(54) BOARD INSPECTING APPARATUS AND METHOD OF COMPENSATING BOARD DISTORTION USING THE SAME

(71) Applicant: KOH YOUNG TECHNOLOGY INC., Seoul (KR)

(72) Inventors: Seung Won Jung, Seoul (KR); Jong Jin Choi, Gwangmyeong-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 39 days.

(21) Appl. No.: 16/339,213

(22) PCT Filed: Sep. 22, 2017

(86) PCT No.: PCT/KR2017/010507
§ 371 (c)(1),
(2) Date: Apr. 3, 2019

(87) PCT Pub. No.: WO2018/066852
PCT Pub. Date: Apr. 12, 2018

(65) Prior Publication Data
US 2020/0045862 A1 Feb. 6, 2020

(30) Foreign Application Priority Data
Oct. 4, 2016 (KR) .................. 10-2016-0127350

(51) Int. Cl.
*H05K 13/08* (2006.01)
*G01B 11/24* (2006.01)
*G01N 21/956* (2006.01)

(52) U.S. Cl.
CPC ......... *H05K 13/0815* (2018.08); *G01B 11/24* (2013.01); *G01N 21/956* (2013.01); *G01N 2021/95638* (2013.01)

(58) Field of Classification Search
None
See application file for complete search history.

(56) References Cited

U.S. PATENT DOCUMENTS

| 2008/0015802 A1* | 1/2008 | Urano | G01N 21/9501 |
| | | | 702/81 |
| 2008/0046210 A1* | 2/2008 | Murakami | H05K 13/083 |
| | | | 702/82 |

(Continued)

FOREIGN PATENT DOCUMENTS

| EP | 3 046 406 | 7/2016 |
| KR | 10-2011-0105512 | 9/2011 |

(Continued)

OTHER PUBLICATIONS

International Search Report for International Application No. PCT/KR2017/010507, dated Jan. 11, 2018.

*Primary Examiner* — Fayyaz Alam
(74) *Attorney, Agent, or Firm* — Kile Park Reed & Houtteman PLLC

(57) ABSTRACT

A board inspecting apparatus include a measuring section, a processing section and a display section. The measuring section obtains measurement data for at least a portion of a board. The processing section compares the measurement data and reference data of the board, based on selection feature objects, by associated selection feature objects, to perform distortion compensation for the board, and inspects the board with distortion compensation. The display section distinguishably displays a first area with the distortion compensation successful and a second area with the distortion compensation failed. The processing section compares a number of recognizable effective feature objects with a reference number, and determine the distortion compensation as failed when the number of the recognizable effective feature objects is below the reference number. Thus, user's (Continued)

convenience may be improved, a user may easily recover failure of distortion compensation, and accurate and valid distortion compensation may be available.

8 Claims, 4 Drawing Sheets

(56) References Cited

U.S. PATENT DOCUMENTS

| | | | | |
|---|---|---|---|---|
| 2010/0246931 A1* | 9/2010 | Kim | ..................... | G01N 21/956 382/141 |
| 2012/0123719 A1* | 5/2012 | Hwang | .............. | G01N 21/8851 702/85 |
| 2012/0130666 A1* | 5/2012 | Cho | ..................... | G01N 21/956 702/87 |
| 2014/0168419 A1* | 6/2014 | Cho | ................. | G01N 21/95684 348/126 |

FOREIGN PATENT DOCUMENTS

| | | |
|---|---|---|
| KR | 10-2012-0069646 | 6/2012 |
| KR | 10-1447570 | 10/2014 |
| KR | 10-2015-0045413 | 4/2015 |
| KR | 10-2015-0053798 | 5/2015 |
| WO | 2015/037916 | 3/2015 |

\* cited by examiner

BOARD INSPECTING APPARATUS AND METHOD OF COMPENSATING BOARD DISTORTION USING THE SAME

TECHNICAL FIELD

The present invention relates to a board inspecting apparatus and a method of compensating board distortion using the same. More particularly, the present invention relates to a board inspecting apparatus inspecting an area in which distortion is compensated and a method of compensating board distortion using the same.

BACKGROUND ART

In general, at least one printed circuit board (PCB) is provided in an electronic device, and various circuit components such as a circuit pattern, a connection pad portion, and a driving chip electrically connected to the connection pad portion are mounted on the printed circuit board.

In general, a board inspecting apparatus is used to verify that the above various circuit components are properly formed or placed on the printed circuit board.

A conventional board inspecting apparatus sets a predetermined inspection area and inspects whether solder is properly formed or specific circuit components are properly installed in the inspection area. In a conventional method of setting the inspection area, an area in which a circuit component should theoretically exist is merely set as an inspection area.

The inspection area should be precisely set to a desired location so that measurement may be performed properly. However, since a measurement target such as a printed circuit board may have distortions such as bending and twisting of a board, a conventional inspection area cannot be accurately set at a desired position, and there is a problem that a certain difference occurs between an image acquired by a camera of an image-capturing part and a position where the circuit component theoretically exists. Therefore, it is necessary to set an inspection area in which distortion of the measurement target as the above is compensated appropriately.

Conventionally, in order to set an inspection area in which distortion of a measurement target is appropriately compensated, there has been made an attempt to acquire and compare reference data and measurement data for the measurement area set on the board and compensate the same to thereby set an accurate inspection area, for example, in Korean Patent No. 10-1132779 of the applicant. However, when the reference data and the measurement data are not properly compared or incorrect compensation is done, accurate distortion compensation may not be obtained.

DISCLOSURE

Technical Problem

Accordingly, the present invention provides a board inspecting apparatus improving user's convenience, capable of easily correcting failure of distortion compensation, and capable of allowing accurate and valid distortion compensation.

In addition, the present invention also provides a method of compensating board distortion using the above-mentioned board inspecting apparatus.

Technical Solution

According to an exemplary embodiment of the present invention, a board inspecting apparatus include a measuring section, a processing section and a display section. The measuring section obtains measurement data for at least a portion of a board. The processing section compares the measurement data of the board and previously obtained reference data of the board, based on a plurality of selection feature objects set on the board, wherein the processing section compares selection feature objects of the measurement data and associated selection feature objects of the reference data, to perform distortion compensation for the board, and inspects the board in which distortion is compensated. The display section, after the distortion compensation of the board is performed, distinguishably displays a first area corresponding to such an area that the distortion compensation has succeeded and a second area corresponding to such an area that the distortion compensation has failed. The processing section, when performing the distortion compensation of the board, compares a number of effective feature objects that are recognizable among the selection feature objects set for distortion compensation of the board with a reference number that is predetermined, and determine the distortion compensation as failed in case that the number of the recognizable effective feature objects is less than the reference number.

In one embodiment, the processing section may set a compensation unit, which is a basic unit for performing the distortion compensation, and the display section may display the first area and the second area for each compensation unit. For example, the compensation unit may be set based on at least one of each panel forming an array on the board, a field of view image-captured by an image-capturing part of the measuring section and an area input by a user.

In one embodiment, the board inspecting apparatus may further include an input section for inputting substitute feature objects. The input section may further receive at least one of the substitute feature objects from the user such that the number of the recognizable effective feature objects in the second area is greater than or equal to the reference number. The processing section may construct modified selection feature objects by changing at least one of the selection feature objects into the substitute feature object, and re-perform distortion compensation for the second area based on the modified selection feature objects.

According to an exemplary embodiment of the present invention, a method of compensating board distortion, as a board inspection method by using a board inspecting apparatus that inspects a board as an inspection target in which distortion is compensated by performing distortion compensation of the board, includes comparing measurement data of the board and previously obtained reference data of the board, based on a plurality of selection feature objects set on the board, wherein selection feature objects of the measurement data are compared with associated selection feature objects of the reference data, to perform distortion compensation for the board, and distinguishably displaying a first area corresponding to such an area that the distortion compensation has succeeded and a second area corresponding to such an area that the distortion compensation has failed. When performing the distortion compensation of the board, a number of effective feature objects that are recognizable among the selection feature objects set for distortion compensation of the board is compared with a reference number that is predetermined, and the distortion compensation is determined as failed in case that the number of the recognizable effective feature objects is less than the reference number.

In one embodiment, after distinguishably displaying the first area and the second area, the method may further include constructing modified selection feature objects by changing a portion of the selection feature objects to another feature object such that the number of the recognizable effective feature objects in the second area is greater than or equal to the reference number. According to an exemplary embodiment of the present invention, a computer readable non-transitory recording medium recording a program implementing the method may be provided.

Advantageous Effects

According to the present invention, in inspecting the board with distortion compensation by performing distortion compensation of an inspection target board, after the distortion compensation of the board is performed, a first area corresponding to such an area that the distortion compensation has succeeded and a second area corresponding to such an area that the distortion compensation has failed are distinguishably displayed, and the distortion compensation is determined as failed and displayed in case that the number of effective feature objects that are recognizable is less than a reference number, thereby improving user's convenience, easily recovering the failure of the distortion compensation, and allowing accurate and valid distortion compensation.

In addition, the compensation unit for the distortion compensation may be established in various ways, and the first area and the second area are displayed for each compensation unit, so that a user may conveniently check failure of distortion compensation for each compensation unit.

Also, at least a portion of the feature objects may be modified so that the second area not meeting the compensation criteria may meet the compensation criteria, and the distortion compensation is performed again, thereby allowing accurate and valid distortion compensation.

MODE FOR INVENTION

Figure 1:
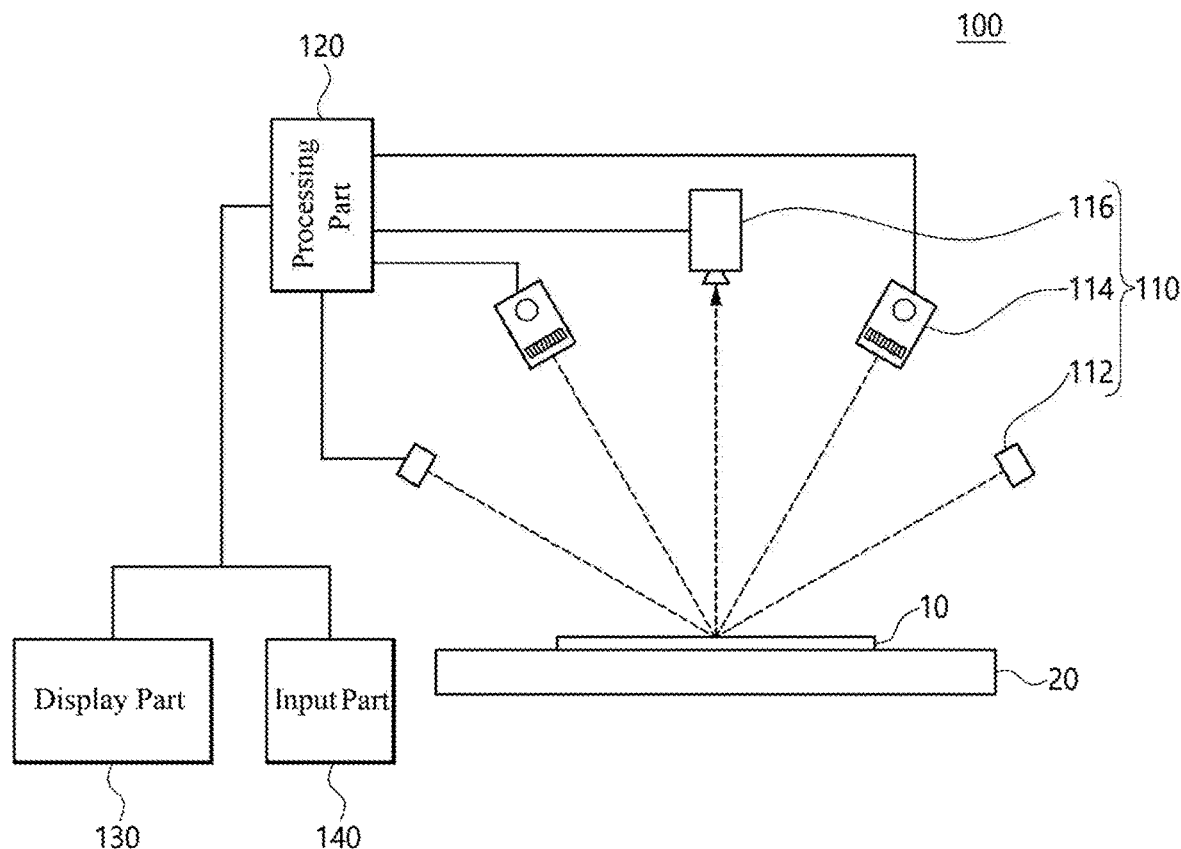
FIG. 1 is a conceptual view of a board inspecting apparatus according to an exemplary embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that, although the terms first, second, etc. may be used herein to describe various elements, these elements should not be limited by these terms. These terms are only used to distinguish one element from another element. For example, a first element discussed below could be termed a second element, and similarly, a second element may also be termed a first element, without departing from the teachings of the present invention.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs.

It will be further understood that terms, such as those defined in commonly used dictionaries, should be interpreted as having a meaning that is consistent with their meaning in the context of the relevant art and will not be interpreted in an idealized or overly formal sense unless expressly so defined herein. The terms used in the present application are defined as follows.

A feature object indicates at least a portion of a specific object formed on a board with having a predetermined shape. For example, the feature object may include a fiducial, a hole pattern, a curved circuit pattern, and the like, which are formed on a board.

The feature object is used specifically as follows.

1) candidate feature objects: all or individual of recognizable or recognized feature objects 2) selection feature objects: more than a reference number of feature objects selected for distortion compensation 3) effective feature objects: feature objects that are recognizable in a specific area among selection feature objects and can be utilized for distortion compensation in the specific area 4) non-eligible feature objects: feature objects that are not recognizable in a specific area among selection feature objects and cannot be utilized for distortion compensation in the specific area 5) substitute feature objects: feature objects newly selected from candidate feature objects in order to replace non-eligible feature objects 6) modified selection feature objects: more than a reference number of feature objects that are newly constructed by replacing non-eligible feature objects with substitute feature objects The present invention may be illustrated as being implemented in a suitable computing environment. In addition, various methods according to the present invention may be provided as a recording medium that records a computer-software for implementing the methods.

The recording medium typically includes a variety of computer readable media, and may be provided as any available media that can be accessed by a computer. Further, the recording medium includes volatile or non-volatile media, removable or non-removable media, etc. For example, the recording medium may include all the media implemented in any method or technology for storage of information such as computer readable instructions, data structures, program modules or other data. In addition, the recording medium includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer.

Hereinafter, exemplary embodiments of the present invention will be described in detail with reference to the accompanying drawings.

FIG. 1 is a conceptual view of a board inspecting apparatus according to an exemplary embodiment of the present invention.

Referring to FIG. 1, a board inspecting apparatus 100 according to an embodiment of the present invention includes a measuring section 110, a processing section 120, and a display section 130.

The measuring section 110 obtains measurement data for at least a portion of the board 10.

The board 10 may be placed on a stage 20 and the stage 20 may be transferred to a predetermined position by control of the processing section 120 described later or by control of an externally provided transfer apparatus.

The measurement data may include a real photographed image of the board 10 or related data.

In one embodiment, the measuring section 110 may include a first illumination part 112, a second illumination part 114, and an image-capturing part 116, and the measurement data may include a captured image obtained at the image-capturing part 116.

The first illumination part 112 may provide non-patterned illumination. The non-patterned illumination may be, for example, an illumination to obtain a plane image of the two-dimensional shape of the measurement target formed on the board 10. The plane image may include at least one information of color, brightness or brightness, and saturation of the measurement target.

In one embodiment, the first illumination part 112 may include a plurality of illumination units arranged in a circular shape on the basis of the measurement target, which is a measurement object, when viewed in a plane view, to irradiate light. For example, the first illumination part 112 may include a light source that emits white light or monochromatic light of a predetermined color, and may irradiate a plurality of different color lights such as red, green, and blue at different inclination angles. In the first illumination part 112, a plurality of LEDs may be continuously arranged so as to respectively have a ring shape.

The second illumination part 114 may provide pattern illumination. The pattern illumination may be, for example, an illumination for acquiring a pattern image from which a three-dimensional shape of the measurement target may be extracted. In one embodiment, the second illumination part 114 may include a plurality of pattern illumination units arranged to obliquely irradiate grating pattern light in different directions toward the measurement target. For example, the second illumination part 114 may illuminate the grating pattern light forming a grating pattern for obtaining three-dimensional shape information of the measurement target, obliquely based on a normal line perpendicular to the plane of the measurement target. Also, the second illumination part 114 may be disposed apart from each other along the circumferential direction about the measurement target, or may be arranged at each vertex of a polygon in which the measurement target is centered. The second illumination part 114 may be alternately arranged at regular intervals in a position to divide a circumference. The pattern illumination units of the second illumination part 114 may be provided with M (M is a natural number greater than or equal to 2), and for example, may be provided with various numbers of 2, 4, or 8.

In one embodiment, each pattern illumination unit of the second illumination part 114 may illuminate the grating pattern light N times toward the measurement target (N is a natural number greater than or equal to 2). In order to illuminate phase-shifted grating pattern light, the pattern illumination unit may transfer grating pattern N times, by using a pattern image employing a digital light processing (DLP) method using a digital micro-mirror display (DMD), or a pattern image of a liquid crystal display device, and may transfer grating pattern by using a pattern image of various display method. Alternatively, the grating pattern may be physically transferred N times by using a grating transfer mechanism.

The image-capturing part 116 may obtain a two-dimensional plane image of the measurement target based on the non-patterned illumination of the first illumination part 112, and may obtain a pattern image of the measurement target based on the patterned illumination of the second illumination part 114. From the pattern image, a three-dimensional shape of the measurement target may be calculated, for example, by applying a method such as a bucket algorithm. On the other hand, the image-capturing part 116 may be provided with K (K is a natural number greater than or equal to 1), and may be arranged at various angles based on a normal line perpendicular to the plane of the measurement target. Also, the second illumination part 114 of the measuring section 110 may be provided with L (L is a natural number greater than or equal to 1), so that the measuring section 110 may include various types such as 1:K, L:1, L:K, and the like between the second illumination part 114 and the image-capturing part 116.

The measurement data may include a captured image such as a two-dimensional plane image obtained from the image-capturing part 116. In addition, the board 10 may be inspected using the two-dimensional plane image and/or the pattern image.

The processing section 120 performs distortion compensation of the board 10 by comparing the measurement data of the board 10 with previously obtained reference data of the board 10, based on a plurality of feature objects set on the board 10. In addition, the processing section 120 may perform various inspections for the board 10 with distortion compensation. For example, the processing section 120 may include a computer or a central processing part of a computer, and may include a control device performing a similar function.

Particularly, since there may be distortion in the inspection area set for the inspection of the board 10, a predetermined feature object is established on the board in order to set the inspection area with distortion compensation, and the compensation may be performed by judging distortion of the inspection area based on the feature object. In this case, the feature object is a reference for comparing the measurement data of the board 10 and the previously obtained reference data of the board, and distortion compensation may be performed by comparing the feature object of the measurement data and the feature object of the reference data for associated feature objects.

In one embodiment, between known reference data or reference data taught according to a teaching mode and the measurement data such as a captured image, the distortion of the board is determined from the change of the feature object caused by the distortion of the board 10, and then more accurate inspection may be performed by setting the inspection area with distortion compensation. For example, changes in the feature object may include changes in shape, changes in size, changes in a distance between the feature objects, changes in a geometry between the feature objects, and so on.

The establishment of the selection feature object may be done by user input via an input section described below or automatically by the processing section 120.

The distortion of the board 10 may occur in various forms due to various causes. For example, the board 10 may include distortion being such as bent, twisted, curved, rugged, etc., which are formed locally or globally due to the cause of manufacturing or handling. In one embodiment, the distortion compensation of the board 10 may include warpage compensation of the board.

The reference data may be a theoretical plane image for the board 10.

In one embodiment, the reference data may be obtained from CAD information or gerber information, which record the shape for the board 10. The CAD information or gerber information includes design reference information of the board, and generally includes layout information about pads, circuit patterns, circular patterns, and so on.

In another embodiment, the reference data may be obtained from teaching information obtained by a teaching mode. In the teaching mode, for example, board information is searched in the database, and in case that board information is not available as a search result of the database, teaching of a bare board is performed. Then, the teaching of the bare board is completed and when board information such as pad and wiring information of the bare board is calculated, the board information is stored in the database. That is, the design reference information of a printed circuit board may be obtained by teaching the bare board of the printed circuit board in the teaching mode, and the reference data may be obtained by acquiring the teaching information through the teaching mode.

The reference data may be obtained in advance, and the measurement data may be distorted compared with the reference data due to bending, twisting, etc. of the board. Thus, by comparing the reference data with the measurement data, distortion compensation of the board 10 may be performed and the board 10 with distortion compensation may be inspected.

In this case, the processing section 120 may select a plurality of selection feature objects greater than the reference number among many candidate feature objects existing on the board 10, and use the selection feature objects as a basis of the comparison. The candidate feature objects may include a fiducial, a hole pattern, a corner portion of a curved circuit pattern and the like, which are formed on the board 10. By comparing the reference data with the measurement data based on the coordinates of the center point of the hole pattern or the coordinates of the corner point of the curved circuit pattern, a conversion relationship between the reference data and the measurement data, which represents the distortion of the measurement data for the reference data, may be obtained.

The display section 130 displays an image for inspection of the board 10. For example, the display section 130 may include a display device such as a monitor connected to the processing section 120. A user may perform an inspection of the board 10 using various videos and selection options displayed in the display section 130.

The processing section 120 compares the number of effective feature objects that are recognizable among the selection feature objects established for distortion compensation of the board 10 with a preset reference number when performing distortion compensation of the board 10, and in case that the number of the recognizable effective feature objects is less than the reference number, the distortion compensation is determined as failed.

In case that the number of the effective feature objects that are recognizable in the processing section 120 is less than a predetermined reference number, the basic data for acquiring the conversion relationship between the reference data and the measurement data is insufficient, so that the conversion relationship may not be acquired, or the conversion relationship may be inaccurate, and in such a case, the distortion compensation may be regarded as failed.

On the other hand, when performing the distortion compensation of the board 10, the distortion compensation may be regarded as successful in case that the number of the effective feature objects that are recognizable among the selection feature objects set for the distortion compensation of the board 10 is equal to or greater than the reference number.

The number of effective feature objects that are recognizable in the processing section 120 may be reduced by various causes. For example, when the board 10 is contaminated such as a foreign matter attached to a specific position of the board 10, the recognition rate of the feature object of the foreign matter attached portion is lowered, so that the number of effective feature objects may be below a reference number. In addition, when vendors are different, the boards 10 produced according to the vendors may be somewhat different, in which case the number of the effective feature objects that are recognizable may be below the reference number for a particular vendor.

The display section 130 distinguishably displaying an area that the distortion compensation has succeeded and an area that the distortion compensation has failed, after the distortion compensation of the board 10 is performed.

Figure 2:
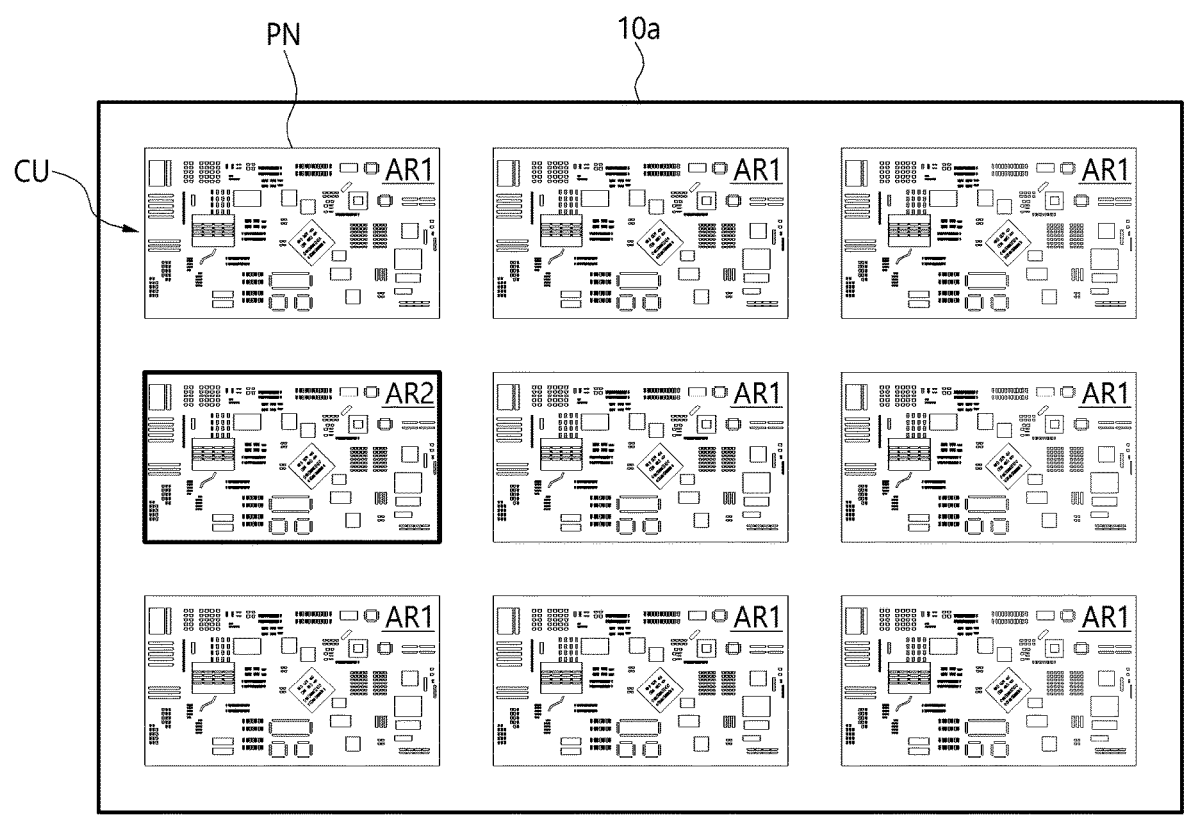
FIG. 2 is a conceptual view for explaining an example that the display section in FIG. 1 displays a first area and a second area.

FIG. 2 is a conceptual view for explaining an example that the display section in FIG. 1 displays a first area and a second area.

Referring to FIGS. 1 and 2, the display section 130 displays a board image 10a corresponding to the board 10. The display section 130 distinguishably displays a first area AR1 corresponding to such an area that the distortion compensation has succeeded and a second area AR2 corresponding to such an area that the distortion compensation has failed. In one embodiment, in FIG. 2, the second area AR2 is displayed to be emphasized relative to the first area AR1.

In another embodiment, the first area AR1 and the second area AR2 may be displayed in different colors. For example, the first area AR1 and the second area AR2 may be displayed distinguishably in different colors, such as green and red, respectively.

Alternatively, the first area AR1 and the second area AR2 may be displayed distinguishably by various methods such as different line widths, different background colors, reversed images, etc.

In one embodiment, the processing section 120 may set a compensation unit CU, which is a basic unit for performing the distortion compensation. Herein, the display section 130 may display the first area AR1 and the second area AR2 by the compensation unit CU.

For example, the compensation unit CU may be established by at least one of each panel forming an array on the board 10, a field of view image-captured by the image-capturing part 116 of the measuring section 110 and an area input by a user. In FIG. 2, the compensation unit CU is set for each panel PN forming a 3×3 array. Accordingly, the processing section 120 may determine whether the distortion compensation is appropriate for each panel PN, and the display section 130 displays the panel PN corresponding to one among the first area AR1 and the second area AR2 for each panel PN.

Meanwhile, before distinguishably displaying the first area AR1 and the second area AR2, or at the same time, the display section 130 may display an ideal image of the board 10, which is in case that all the distortion compensations are successful, so that the compensation result may be easily grasped in comparison with the case that the distortion compensation is successful.

A user may easily check the first area AR1 and the second area AR2 distinguishably displayed in the display section 130. When the second area AR2 exists, the cause of the compensation failure may be found and solved such that the number of the recognizable effective feature objects in the second area AR2 may be greater than or equal to the reference number.

In one embodiment, the processing section 120 may automatically change at least one of the selection feature objects. For example, when the number of the recognizable effective feature objects among the selection feature objects in a specific area is insufficient, the processing section 120 may perform modification such as excluding non-eligible feature objects from the selection feature objects that are not well recognized in the associated area, and selecting and adding other substitute feature objects, to thereby construct modified selection feature objects. The processing section 120 may perform distortion compensation again for the second area AR2 based on the modified selection feature objects.

For example, when the board image 10*a* for the board 10 includes the panels PN forming an array, and compensation of each panel PN is performed by a compensation unit of each panel PN, when the panels PN are the same kind of panels, the same selection feature objects may be set for each panel PN. However, after the compensation is performed, when a foreign matter is attached to any one feature object of a specific panel and the feature object is not recognized, another substitute feature object is newly selected and added instead of the associated non-eligible feature object, thereby recovering failure of the distortion compensation of the specific panel.

In one embodiment, the board inspecting apparatus 100 may further include an input section 140.

The input section 140 receives inputs of the feature objects. For example, the input section 140 may include at least one of a computer keyboard, a mouse, a touchpad, and a touch panel.

The input section 140 may further receive at least one substitute feature object from a user such that the number of the recognizable effective feature objects in the second area AR2 is greater than or equal to the reference number. For example, due to the cause of foreign matter attachment as described above, there is a case that effective feature objects that are recognizable in other areas are non-eligible feature objects that are not recognizable in a specific area, so that the number of the recognizable effective feature objects is insufficient. In this case, the processing section 120 may make changes such as excluding non-eligible feature objects that are not well recognized in the specific area and adding substitute feature objects input from a user through the input section. Herein, the processing section 130 may modify at least one of the selection feature objects to construct modified selection feature objects, and perform distortion compensation again for the second area AR2 based on the modified selection feature objects.

Hereinafter, a method of compensating board distortion using the board inspecting apparatus 100 will be described in more detail with reference to the drawings.

Figure 3:
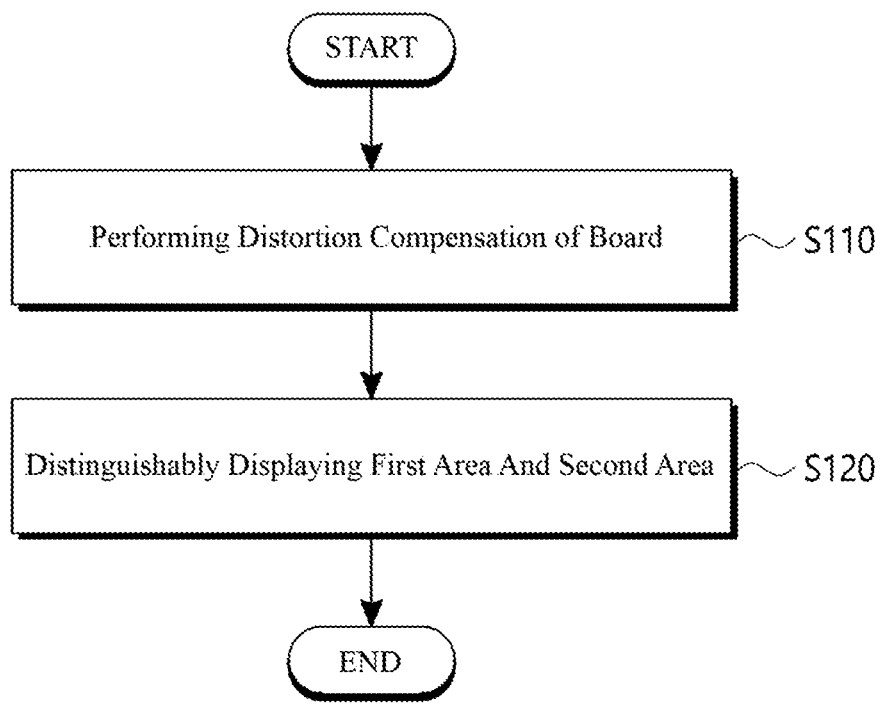
FIG. 3 is a flow chart showing a method of compensating board distortion according to an exemplary embodiment of the present invention.

FIG. 3 is a flow chart showing a method of compensating board distortion according to an exemplary embodiment of the present invention.

Referring to FIGS. 1 to 3, in order to perform distortion compensation of the board 10 according to an embodiment of the present invention, first, distortion compensation of the board 10 is performed based on a plurality of selection feature objects set on the board 10 in step of S110.

Particularly, the measurement data of the board 10 is compared with the previously obtained reference data of the board, based on a plurality of selection feature objects set on the board 10, and herein, the selection feature objects of the measurement data and the selection feature objects of the reference data are compared for the associated selection feature objects, to perform distortion compensation of the board 10.

When performing the distortion compensation, the number of recognizable effective feature objects is compared with the reference number.

Particularly, the number of effective feature objects that are recognizable among the selection feature objects set for the distortion compensation of the board is compared with a preset reference number, to judge whether the number of the recognizable effective feature objects is greater than or equal to the reference number.

Thereafter, in the image for inspection of the board, a first area corresponding to such an area that the distortion compensation has succeeded and a second area corresponding to such an area that the distortion compensation has failed are distinguishably displayed in step of S120.

In one embodiment, the first area AR1 and the second area AR2 may be displayed in different colors, and for example, the first area AR1 and the second area AR2 may be displayed distinguishably in different colors such as green color and red color, respectively.

Alternatively, the first area AR1 and the second area AR2 may be displayed distinguishably by various methods such as different line widths, different background colors, reversed images, etc.

Thus, a user may easily check the area where the number of the recognizable effective feature objects is less than the reference number, and when the second area AR2 exists, the user may perform a process of additional distortion compensation again.

Figure 4:
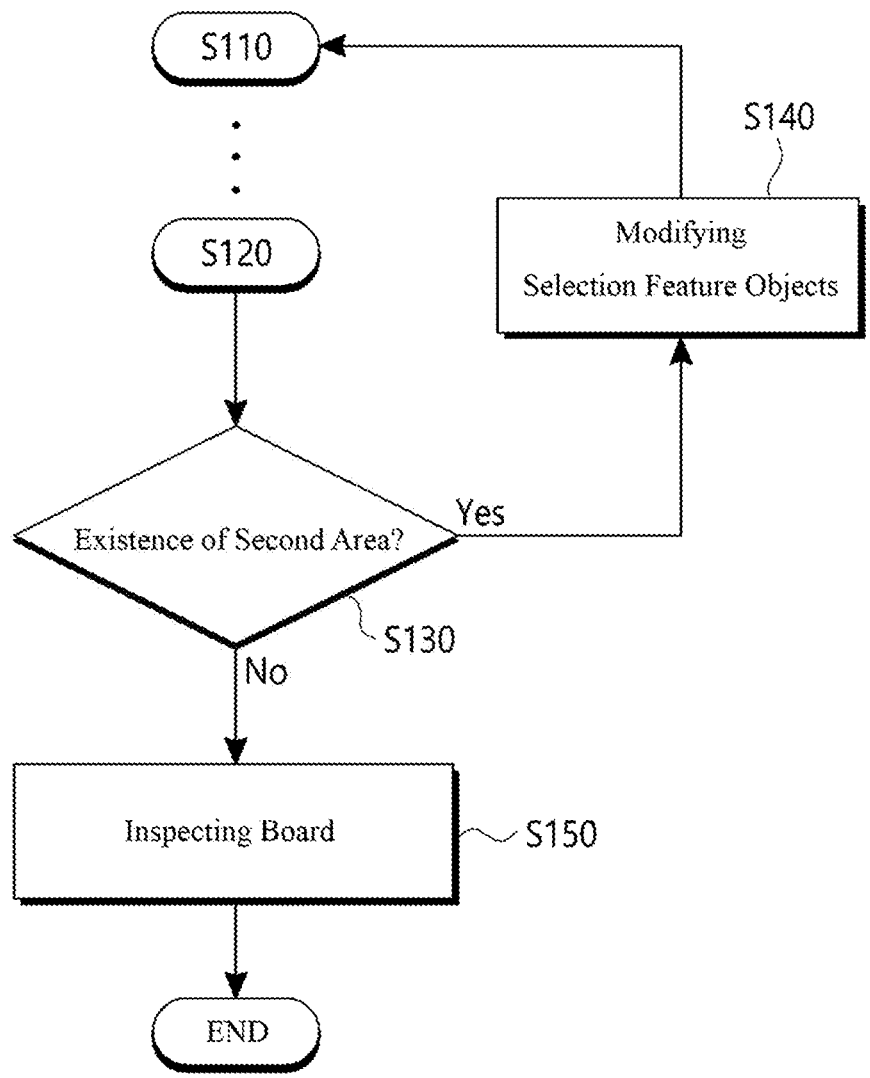
FIG. 4 is a flow chart for explaining processes according to existence or non-existence of the second region in FIG. 3.

FIG. 4 is a flow chart for explaining processes according to existence or non-existence of the second region in FIG. 3.

Referring to FIGS. 2 to 4, after comparing the number of effective feature objects that are recognizable with the reference number and displaying the result in step of S120, different processes may be performed depending on the presence or absence of the second area AR2 in which the number of the recognizable effective feature objects is less than the reference number.

After checking the presence or absence of the second area AR2 in step of S130, when the second area AR2 is present (Yes), at least one of the selection feature objects may be modified so that the number of the recognizable effective feature objects in the second area AR2 is greater than or equal to the reference number in step of S140.

In one embodiment, at least one substitute feature object is additionally input from a user through the input section 140 to modify at least one of the selection feature objects to construct a modified selection feature objects in step of S150, and based on the modified selection feature objects, the distortion compensation for the second area AR2 may be performed again. Herein, the distortion compensation may be performed again for the entire board 10, but the distortion compensation may be performed only for the second area AR2.

On the other hand, after checking the presence or absence of the second area AR2 in step of S130, when the second area AR2 is absent (No), it is determined that the distortion compensation of the board 10 is successful, and inspection areas of the board 10 with distortion compensation may be inspected in step of S150.

Meanwhile, as a result of checking the existence of the second area AR2 in step of S130 even after changing the selection feature objects by excluding the non-eligible feature object, when the second area AR2 still exists, at least one of the selection feature objects may be continuously modified so that the number of the recognizable effective feature objects in the second area AR2 is greater than or equal to the reference number. Herein, the reference number of modification times to modify the selection feature objects or the reference time to be elapsed may be established in advance. When the second area AR2 still exists although the selection feature objects are modified by the reference number of modification times and/or for the reference time, the distortion compensation process may be terminated automatically with the distortion compensation completed for the first area AR1 and without any further trial to perform distortion compensation for the second area AR2. Alternatively, regardless of the reference number of modification times and/or the reference time, the distortion compensation process may be forced to end according to a termination instruction entered by a user via the input section 140.

In case that the distortion compensation process is terminated with including the second area AR2, the second area AR2 may be determined to be defective without further inspection and may not perform the subsequent inspection process after the distortion compensation (for example, a panel corresponding to the second area AR2 is determined to be defective), or the inspection process may be performed without the distortion compensation process.

Meanwhile, the board inspecting apparatus 100 and the method of compensating board distortion using the same may be provided as an apparatus supporting distortion compensation of an inspection target board, which includes a predetermined interface type.

According to the board inspecting apparatus and the method of compensating board distortion, in inspecting the board with distortion compensation by performing distortion compensation of an inspection target board, after the distortion compensation of the board is performed, a first area corresponding to such an area that the distortion compensation has succeeded and a second area corresponding to such an area that the distortion compensation has failed are distinguishably displayed, and the distortion compensation is determined as failed and displayed in case that the number of effective feature objects that are recognizable is less than a reference number, thereby improving user's convenience, easily recovering the failure of the distortion compensation, and allowing accurate and valid distortion compensation.

In addition, the compensation unit for the distortion compensation may be established in various ways, and the first area and the second area are displayed for each compensation unit, so that a user may conveniently check failure of distortion compensation for each compensation unit.

Also, at least a portion of the feature objects may be modified so that the second area not meeting the compensation criteria may meet the compensation criteria, and the distortion compensation is performed again, thereby allowing accurate and valid distortion compensation.

It will be apparent to those skilled in the art that various modifications and variations may be made in the present invention without departing from the spirit or scope of the invention. Thus, it is intended that the present invention cover the modifications and variations of this invention provided they come within the scope of the appended claims and their equivalents.

The invention claimed is:

1. A board inspecting apparatus, comprising:
   a measuring section obtaining measurement data for at least a portion of a board;
   a processing section comparing the measurement data of the board and previously obtained reference data of the board, based on a plurality of selection feature objects set on the board, wherein the processing section compares selection feature objects of the measurement data and associated selection feature objects of the reference data, to perform distortion compensation for the board, and inspects the board in which distortion is compensated; and
   a display section, after the distortion compensation of the board is performed, distinguishably displaying a first area corresponding to such an area that the distortion compensation has succeeded and a second area corresponding to such an area that the distortion compensation has failed;
   wherein the processing section, when performing the distortion compensation of the board, compares a number of effective feature objects that are recognizable among the selection feature objects set for distortion compensation of the board with a reference number that is predetermined, and determine the distortion compensation as failed in case that the number of the recognizable effective feature objects is less than the reference number.

2. The board inspecting apparatus of claim 1, wherein the processing section sets a compensation unit, which is a basic unit for performing the distortion compensation, and
   wherein the display section displays the first area and the second area for each compensation unit.

3. The board inspecting apparatus of claim 2, wherein the compensation unit is set based on at least one of each panel forming an array on the board, a field of view image-captured by an image-capturing part of the measuring section and an area input by a user.

4. The board inspecting apparatus of claim 1, further comprising an input section for inputting substitute feature objects,
   wherein the input section further receives at least one of the substitute feature objects from the user such that the number of the recognizable effective feature objects in the second area is greater than or equal to the reference number, and
   wherein the processing section constructs modified selection feature objects by changing at least one of the selection feature objects into the substitute feature object, and re-performs distortion compensation for the second area based on the modified selection feature objects.

5. A method of compensating board distortion, as a board inspection method by using a board inspecting apparatus that inspects a board as an inspection target in which distortion is compensated by performing distortion compensation of the board, the method comprising:

comparing measurement data of the board and previously obtained reference data of the board, based on a plurality of selection feature objects set on the board, wherein selection feature objects of the measurement data are compared with associated selection feature objects of the reference data, to perform distortion compensation for the board; and distinguishably displaying a first area corresponding to such an area that the distortion compensation has succeeded and a second area corresponding to such an area that the distortion compensation has failed;

when performing the distortion compensation of the board, wherein a number of effective feature objects that are recognizable among the selection feature objects set for distortion compensation of the board is compared with a reference number that is predetermined, and the distortion compensation is determined as failed in case that the number of the recognizable effective feature objects is less than the reference number.

6. The method of claim 5, after distinguishably displaying the first area and the second area, further comprising constructing modified selection feature objects by changing a portion of the selection feature objects to another feature object such that the number of the recognizable effective feature objects in the second area is greater than or equal to the reference number.

7. A computer readable non-transitory recording medium recording a program implementing the method of claim 5.

8. A computer readable non-transitory recording medium recording a program implementing the method of claim 6.

* * * * *